(12) United States Patent
Guernalec et al.

(10) Patent No.: US 10,196,731 B2
(45) Date of Patent: Feb. 5, 2019

(54) TREATMENT METHOD FOR MODIFYING THE REFLECTED COLOUR OF A SAPPHIRE MATERIAL SURFACE

(71) Applicant: QUERTECH, Caen (FR)

(72) Inventors: Frederic Guernalec, Liffre (FR); Denis Busardo, Gonneville-sur-Mer (FR)

(73) Assignee: IONICS FRANCE, Hérouville-saint-Clair (FR)

( * ) Notice: Subject to any disclaimer, the term of this patent is extended or adjusted under 35 U.S.C. 154(b) by 0 days.

(21) Appl. No.: 15/312,583

(22) PCT Filed: May 22, 2015

(86) PCT No.: PCT/EP2015/061363
§ 371 (c)(1),
(2) Date: Nov. 18, 2016

(87) PCT Pub. No.: WO2015/177334
PCT Pub. Date: Nov. 26, 2015

(65) Prior Publication Data
US 2017/0114442 A1    Apr. 27, 2017

(30) Foreign Application Priority Data

May 23, 2014   (FR) .................................... 14 01172
Oct. 9, 2014    (FR) .................................... 14 02293

(51) Int. Cl.
| | |
|---|---|
| *C23C 14/00* | (2006.01) |
| *C23C 14/48* | (2006.01) |
| *C30B 29/20* | (2006.01) |
| *C30B 33/04* | (2006.01) |
| *G02B 1/11* | (2015.01) |

(Continued)

(52) U.S. Cl.
CPC .......... *C23C 14/0015* (2013.01); *C01F 7/021* (2013.01); *C23C 14/48* (2013.01); *C30B 29/20* (2013.01); *C30B 33/04* (2013.01); *G02B 1/02* (2013.01); *G02B 1/11* (2013.01); *G02B 1/113* (2013.01); *G02B 1/12* (2013.01); *G06F 3/044* (2013.01); *G06F 2203/04103* (2013.01)

(58) Field of Classification Search
CPC .................................................... C23C 14/48
See application file for complete search history.

(56) References Cited

U.S. PATENT DOCUMENTS

2004/0171196 A1* 9/2004 Walitzki ............ H01L 21/76254
                                                              438/137
2014/0248472 A1* 9/2014 Memering .............. C23C 14/48
                                                              428/192

OTHER PUBLICATIONS

C. CHaiwong, L.D. Yu, K. Schinarakis, T. Vilaithong. Optical property modification of ruby and sapphire by N-ion implantation. Surface and Coatings Technology. 196. 2005. pp. 108-112. (Year: 2005).*

* cited by examiner

*Primary Examiner* — Dah-Wei D. Yuan
*Assistant Examiner* — Kristen A Dagenais-Englehart
(74) *Attorney, Agent, or Firm* — Marshall, Gerstein & Borun LLP

(57) ABSTRACT

A treatment method for modifying the reflected color of a sapphire material surface comprising bombardment by a single- and/or multi-charged gas ion beam so as to modify the reflected color of the treated sapphire material surface, wherein the ions are selected from ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S).

25 Claims, 13 Drawing Sheets

(51) Int. Cl.
  *G02B 1/12* (2006.01)
  *G06F 3/044* (2006.01)
  *G02B 1/02* (2006.01)
  *C01F 7/02* (2006.01)
  *G02B 1/113* (2015.01)

TREATMENT METHOD FOR MODIFYING THE REFLECTED COLOUR OF A SAPPHIRE MATERIAL SURFACE

CROSS-REFERENCE TO RELATED APPLICATIONS

This application is the U.S. National Phase of PCT Application No. PCT/EP2015/061363 filed Mar. 22, 2015, which claims the benefit of French Patent Application No. 1402293 filed Oct. 9, 2014 and French Patent Application No. 1401172 filed May 23, 2014, the respective disclosures of which are each incorporated herein by reference in their entireties.

The invention relates to a treatment method for modifying the reflected colour of a sapphire material surface comprising bombardment by a single- and/or multi-charged gas ion beam.

The present invention also relates to a part made of synthetic sapphire material comprising at least one surface treated according to the said treatment method.

According to the present invention, a "sapphire material" is a material substantially consisting of corundum, i.e. of aluminium oxide ($\alpha$-$Al_2O_3$). A sapphire material may comprise trace amounts of elements such as iron, titanium, chromium, copper, or magnesium that can give corundum respectively blue, yellow, purple, orange, or green colour. Chromium impurities in corundum yield pink or red tint, the latter being usually called "ruby"; rubies are part of sapphire materials according to wording of the present invention. The colour is due to the appearance of energy levels within the corundum band gap, due to the presence of impurities. These levels modify the emission and absorption spectra of the material and thus the colour thereof. Other trace elements may also be part of a sapphire material.

A sapphire material comprises at least 98 weight % of aluminium oxide, as for example at least 99 weight % of aluminium oxide, as for example at least 99.9 weight % of aluminium oxide.

A sapphire material can be made of one or of a plurality of corundum single-crystal(s); it can thus be polycrystalline; according to an embodiment of the present invention, a sapphire material is one corundum single-crystal part.

A sapphire material can be natural or synthetic; according to an embodiment, a sapphire material of the present invention is a synthetic sapphire material.

Since the early 19th Century, it has been known how to manufacture synthetic sapphires (and synthetic rubies) in the laboratory, the chemical composition and physical properties whereof are the same as those of natural gems. It may be possible to detect these synthetic gems by the generally curved crystallisation lines thereof, at least for the oldest productions.

Synthetic sapphire material production is currently at the industrial stage. A synthetic sapphire material can be for example produced by a Czochralski process or by methods deriving from the Czochralski process (such for example Kyropolis method, Bagdasarov method, Stepanov method, EFG (Edge defined Film fed Growth) process); a synthetic sapphire material can also be produced from agglomerated aluminium oxide, sintered and fused (such as by hot isostatic pressing) in an inert atmosphere, yielding a transparent but slightly porous polycrystalline product.

Sapphire materials are also known as "Blue Glass" or "sapphire glass" even though they are not glasses as such, but crystalline material.

In physical terms, synthetic sapphire material is a very hard crystalline material (hardness equal to 9 on the Mohs scale) belonging to the corundum family, having a very high refractive index equal to 1.76.

Sapphires may be heat-treated; gems which are too light, too dark or with high inclusion content may be heated. This process makes it possible to increase the colour and clarity while dissolving the elements present in trace form in the gem.

For the high scratch resistance property thereof, synthetic sapphire material is used in a wide range of applications, such as screens, for example watch glasses, windows, touch screens, lighting device parts, light emitting device (LED) parts, optical components, such as for example device lenses or camera lenses. Using synthetic sapphire materials in the field of smart phones may, for example, be particularly relevant.

Commonly available sapphire material is substantially colourless and substantially neutral in term of chromaticity.

Nevertheless, there is a need for coloured sapphire materials that can be useful for numerous uses.

As for example, jewelry may take advantage of sapphire material mechanical properties and desire to obtain a wide range of colour for said material that could be adjusted or chosen according to design or esthetical needs.

As for another example, the lighting industry may also need coloured sapphire materials to manufacture coloured filters.

As for another example, the screen industry may also need coloured sapphire materials to manufacture coloured screens.

The aim of the invention is that of offering a method for modifying the reflected colour of a sapphire material that open new routes; preferably, said method is not expensive or even though inexpensive and suitable for treating surfaces meeting the needs of numerous applications.

For this purpose, an object of the invention is a treatment method for modifying the reflected colour of a sapphire material surface comprising bombardment by a single- and/or multi-charged gas ion beam so as to produce an ion implanted layer in the sapphire material, wherein:
  the acceleration voltage is chosen in a range between 5 kV and 1000 kV;
  the dose of implanted single- and/or multi-charged gas ions per unit of surface area of each ion beam is chosen in a range between $10^{12}$ ions/cm$^2$ and $10^{18}$ ions/cm$^2$; and,
  the dose of implanted single- and/or multi-charged gas ions and the acceleration voltage are further chosen so that to obtain a modified reflected colour of the treated sapphire material surface compared to the untreated sapphire material surface; and,
  the ions of the single- and/or multi-charged gas ions are selected from ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S).

Thanks to said treatment method one can achieve modifications of the reflected colour of a sapphire material.

Thanks to said treatment method one can treat sapphire material surfaces meeting the needs of numerous applications. Of these applications, mention may be made of: touch screens, windows, watch glasses, light emitting device (LED) parts, lighting device parts, optical components, such as for example device lenses.

New applications of sapphire material may also be developed thanks to the treatment method of the invention.

Furthermore, the treatment method of the invention may be implemented thanks to cost effective devices. It can also be implemented so as to obtain high productivity levels.

The present invention thus opens new routes for treatment and uses of sapphire materials.

According to an embodiment, the colored sapphire material obtained thanks to the treatment method of the present invention also has anti-glare properties.

It is well known that a synthetic sapphire material surface reflects approximately 15.5% of incident light. Such a high light reflection may be a drawback when one wants to read information behind a sapphire material window; it may actually reduce the reading ability of for example a watch or a flat screen for a computer or a mobile phone.

This light reflection on a synthetic sapphire material surface is more generally explained by Fresnel equations giving for a light ray passing through an interface at an angle of incidence of 90°, the following coefficients of reflection (R) and transmission (T):

$$R=((nS-nM)/(nS+nM))^2;$$

$$T=4 \cdot nM \cdot nS/(nS+nM)^2.$$

Coefficient of reflection (R) is also usually called "power reflexion coefficient" or "reflectance";

Coefficient of transmission (T) is also usually called "power transmission coefficient" or "transmittance".

In formula all over the present document, the sign "." means a multiplication sign when it is comprised between two parameters; the sign "x" may also be used to designate a multiplication sign.

nS and nM are the refractive indexes in the visible light range (wavelength value comprised between 400 and 800 nm) of respectively the sapphire material and of the medium joining the sapphire material and separated from it by an interface.

It is noted that R+T=1 (energy conservation).

As for an example, one can calculate R and T for an air/sapphire material configuration, where nM=1 for air (where nM=nA, air refractive index) and nS=1.76 for an example of synthetic sapphire material; here above formula give following results:

R=0.0758 and T=1-R=0.9242;

Thus 7.6% of the light is reflected whereas 92.4% of the light is transmitted due to the refractive index difference between said sapphire material and air. This light reflection level may be considered as high and be a drawback for several uses.

This drawback is even more important when considering a sapphire material surrounded by two air layers, thus having two air/sapphire material interfaces. For such a synthetic sapphire material strip consisting of two sides, the reflection loss is two times greater, i.e. 2×7.6%=15.2%. This high reflection results in difficulty reading data situated under a sapphire material screen or watch glass.

Thanks to the treatment method of the present invention, one can also achieve an anti-glare treatment of a sapphire material; such an anti-glare treatment may result in excellent transmission results, namely in the visible range. According to embodiments, transmission results that have never been reached before can be achieved. According to embodiments, the reflection of an incident wave in the visible range can be reduced at least by one third, as for example by one half, when compared to the reflection of an incident wave in the visible range on the untreated sapphire material, such as for example a wavelength of the incident wave of 560 nm.

According to different embodiments of the present invention, that may be combined according to all technically valuable embodiments:

the ions of the single- and/or multi-charged gas ions are selected from ions of the elements from the list consisting of helium (He), neon (Ne), argon (Ar), krypton (Kr), xenon (Xe), nitrogen (N) and oxygen (O), for example from the list consisting of nitrogen (N) and oxygen (O), for example the ions of the single- and/or multi-charged gas ions are ions of oxygen (O);

the ions for bombardment by a single- and/or multi-charged gas ion beam are produced by an electron cyclotron resonance (ECR) source;

the ions of the gas beam are single- and multi-charged and comprises 10% multi-charged ions or more than 10% multi-charged ions;

the acceleration voltage is chosen in a range between 10 kV and 100 kV;

the dose of implanted single- and/or multi-charged gas ions per unit of surface area is chosen in a range between $10^{16}$ ions/cm$^2$ and $10^{18}$ ions/cm$^2$, for example is chosen in a range between $2 \cdot 10^{16}$ ions/cm$^2$ and $2 \cdot 10^{17}$ ions/cm$^2$;

the dose of implanted single- and/or multi-charged gas ions per unit of surface area is chosen to obtain an atomic concentration of implanted ions greater or equal to 5% and equal or less than 20%;

the sapphire material is movable in relation to the single- and/and multi-charged gas ion beam at a speed, $V_D$, between 0.1 mm/s and 1000 mm/s; according to an embodiment, the same zone of sapphire material is moved under the single- and/or multi-charged gas ion beam along a plurality, NP, of passes at the speed $V_D$;

the treatment comprises bombardment of the sapphire material surface by a plurality of single- and/or multi-charged gas ion beams so as to produce an ion implanted layer in the sapphire material, and wherein the acceleration voltage and/or the element of the ions beams differ from a gas ion beam to another gas ion beam;

the method comprises bombardment a first and a second sapphire material surface, each by one or by a plurality of single- and/or multi-charged gas ion beam(s) so as to produce in the sapphire material an ion implanted layer on the first sapphire material surface and an ion implanted layer on the second sapphire material surface, wherein the first and the second sapphire material surface are substantially parallel surfaces separated by a transparent medium and wherein the acceleration voltage and/or the element of an ions beam for the treatment of the second sapphire material surface differs from respectively the acceleration voltage(s) and/or the element of the ions beam(s) for the treatment of the first sapphire material surface;

different gas ion beams are used and the ions of the different gas ion beams are ions of the same element and the acceleration voltage of the ions beams differ from a gas ion beam to another gas ion beam; according to an embodiment, the acceleration voltage of the ions beams differ from a value comprised between 5 and 50 kV, as for example from a value comprised between 10 and 20 kV;

the acceleration voltage and the dose of implanted single- and/or multi-charged gas ions are further chosen according to additional choice rules; as for examples:

the additional choice rules may comprise using data gathered in a step prior to bombardment by a single- and/or multi-charged gas ion beam of the sapphire material to be treated, wherein:

said step consists in choosing one type of single- and/or multi-charged ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S), performing a plurality of experiments with sapphire materials similar to the one to be treated by using said ions to be bombarded and varying the implanted single- and/or multi-charged gas ion dose per unit of surface area and the acceleration voltage until determining desired implanted single- and/or multi-charged gas ion dose per unit of surface area ranges and acceleration voltage ranges so as to produce an ion implanted layer suitable for obtaining a modified reflected colour of the sapphire material surface;

choosing a single- and/or multi-charged gas ion dose per unit of surface area and an acceleration voltage value within the ranges of the preceding step and treating the sapphire material to be treated with said ions said values;

a data resulting from the plurality of experiments are gathered and handled so as to provide guidelines of colour variation of a sapphire surface according to the element of the single- and/or multi-charged ions beam, the acceleration voltage and the ion dose per unit of surface area;

a the choice of the element of the single- and/or multi-charged ions beam, of the single- and/or multi-charged gas ion dose per unit of surface area and of the acceleration voltage value is done so as to fulfil the requirements of a colour target for the reflected colour of a sapphire material surface.

The present invention is also directed to a part made of synthetic sapphire material comprising at least one surface treated according to the method of any of preceding claims, wherein the dominant wavelength, $\lambda_{DT}$, of the reflected colour of the treated surface is shifted from at least +50 nm or at least −50 nm from the dominant wavelength, $\lambda_{DU}$, of the reflected colour of the untreated sapphire material surface, as for example shifted from at least +100 nm or at least −100 nm.

The present invention is also directed to the use of the treatment method according to any embodiment of preceding method, for treating a solid part made of synthetic sapphire material chosen from the list consisting of a screen, such as for example a touch screen, a window, a watch glass, a lighting device part, such as a light emitting device (LED) part, an optical component, such as for example device lens.

The present invention is also directed to a coloured synthetic sapphire material comprising at least one surface with implanted ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S), wherein the reflection of an incident wave in the visible range on said surface is equal or less to 2%, as for example equal or less to 1%, when measured at a 560 nm wavelength.

When anti-glare properties in the visible range are also desired, following embodiments can be implemented:

bombardment by a single or multi-charged gas ion beam produced by an electron cyclotron resonance (ECR) source where:

the dose of implanted single- and multi-charged gas ions per unit of surface area is chosen in a range between $10^{12}$ ions/cm$^2$ and $10^{18}$ ions/cm$^2$ so as to obtain an atomic concentration of gas ions such that the refractive index n of the implanted layer is approximately equal to $(nA \cdot nS)^{1/2}$ where nA is the index of air and nS the index of synthetic sapphire material;

the acceleration voltage is chosen in a range between 5 kV and 1000 kV so as to obtain an implanted thickness e equal to $p \cdot \lambda/4 \cdot n$ where e is the implanted thickness corresponding to an implantation zone where the atomic concentration of implanted single- and multi-charged gas ions is greater than or equal to 1%, where p is an integer, $\lambda$ the incident wavelength and nL the index of the implanted layer;

in said method, the single- and multi-charged gas ions of the ion beam may be selected from the ions of the elements from the list consisting of helium (He), neon (Ne), argon (Ar), krypton (Kr), xenon (Xe);

in said method, the single- and multi-charge gas ions of the ion beam may be selected from the ions of the gases from the list consisting of nitrogen (N$_2$) and oxygen (O$_2$);

in said method, the acceleration voltage is chosen to obtain an implanted thickness equal to p·100 nm where p is an integer;

in said method, the dose of implanted single- or multi-charged gas ions per unit of surface area may be chosen to obtain an atomic concentration of implanted ions equal to 10% with an uncertainty of (+/−) 5%;

in said method, the choice of the implanted single- and multi-charged gas ion dose per unit of surface area and the choice of acceleration voltage may be made by means of a calculation performed previously for evaluating the implanted single- or multi-charged gas ion dose per unit of surface area to obtain an atomic concentration of implanted ions equal to 10% with an uncertainty of (+/−) 5% based on an ion implantation profile chosen according to the implantation depth;

Examples will now be described with reference to the accompanying drawings wherein.

Some elements in the figures are illustrated for simplicity and clarity and have not necessarily been drawn to scale.

Nevertheless, transmission diagrams have been drawn to scale. Transmission diagrams illustrate variation of a (or of a plurality of) coefficient of transmission (T) (also usually called "power transmission coefficient" or "transmittance") as a function of light wavelength. The wavelength range comprises the visible wavelength range.

Transmission diagrams result from measurements made with a spectrophotometer where an incident light beam passes through two main faces of a sample and where the light transmission through the said sample is measured at a plurality of wavelengths. Said two main faces are usually parallel faces.

Transmission diagrams of sapphire material samples treated by the method of the present invention have been measured with a UV-5200 UV/VIS Spectrophotometer commercialized by METASH Company. In those measurements, the medium facing (and contacting) each of the main faces of the sapphire material samples is air.

Figure 1:
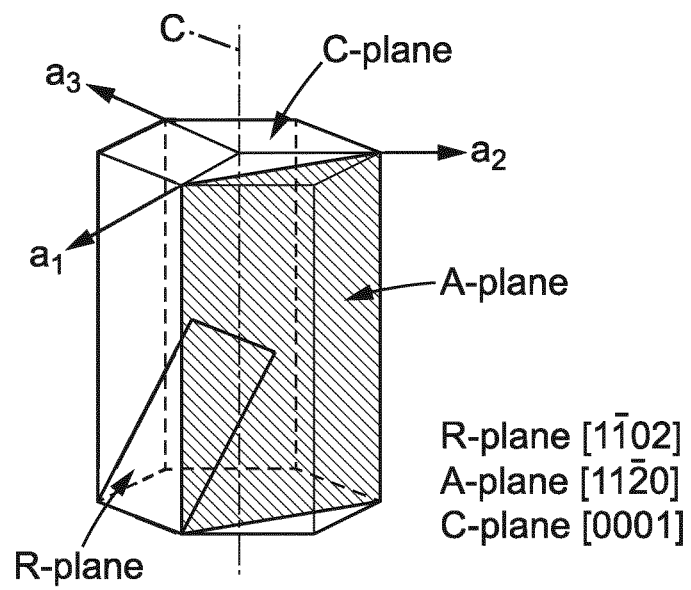
FIG. 1 is a sketch of a sapphire material crystal.

FIG. 1 is a sketch of a sapphire material single-crystal where one can distinguish the crystallographic main features of such a crystal; the sapphire (corundum) single-crystal structure can be represented by ordering octahedron where $O^{2-}$ ions are in tops (peaks) of the octahedrons and $Al^{3+}$ ions are inside of the octahedrons. FIG. 1 shows the structure of the primary planes of the sapphire crystal corresponding to the structure system of sapphire. Shown in this figure are the following planes: C-plane is (0001); A-plane is (1120) and R-plane is (1012). Planes nomenclature corresponds to usual crystallographic nomenclature.

As here above mentioned, commonly available sapphire material is substantially colourless and substantially neutral in term of chromaticity. As here above mentioned, each face of an untreated sapphire material sample reflects approximately 7.75% of incident light; thus the transmission of an untreated sapphire material sample is approximately 84.5% in the visible range.

The inventors have performed tests with sapphire material samples which have been treated according to the present invention.

Used sapphire material samples are either circular or square plates with respectively one inch diameter and 10 mm side; their thickness is equal to or less than 1 mm.

In the following examples, these single- and multi-charged gas ions were emitted by an ECR source (electron cyclotron resonance source).

FIGS. 2 to 5 show transmission diagrams of sapphire material samples treated by the method of the present invention that have been measured after treating sapphire material samples according to following experimental conditions:

As far as FIGS. 2 to 5 are concerned: the single- and/or multi-charged gas ion beam is a single- and multi-charged oxygen ion, $O^+$, $O^{2+}$, $O^{3+}$, beam; estimated distribution of O ions is following: 60% of $O^+$, 30% of $O^{2+}$, 10% of $O^{3+}$.

Figure 2:
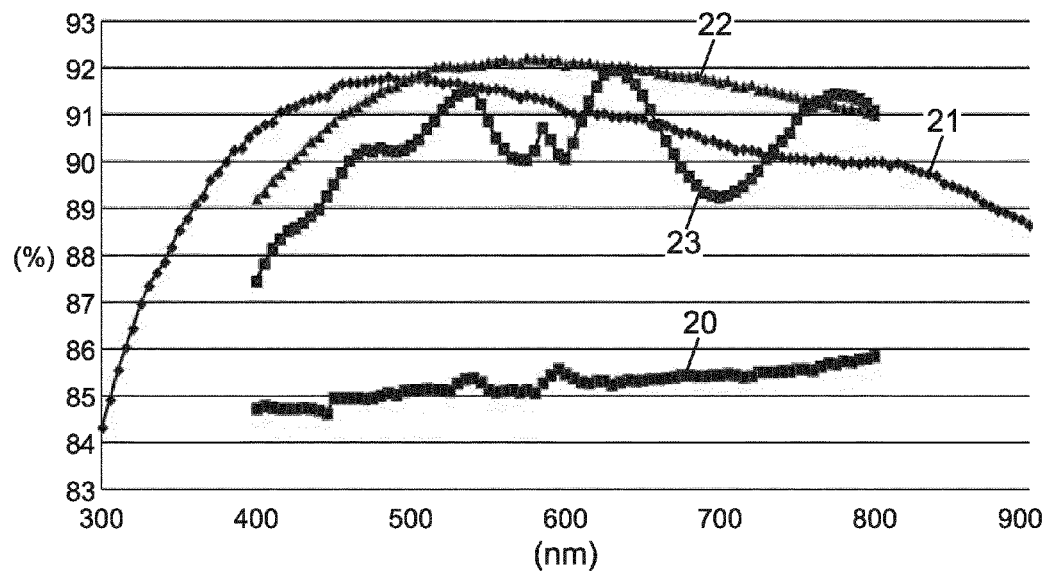
FIGS. 2 to 6 are transmission diagrams of sapphire material samples treated by the method of the present invention.
Figure 3:
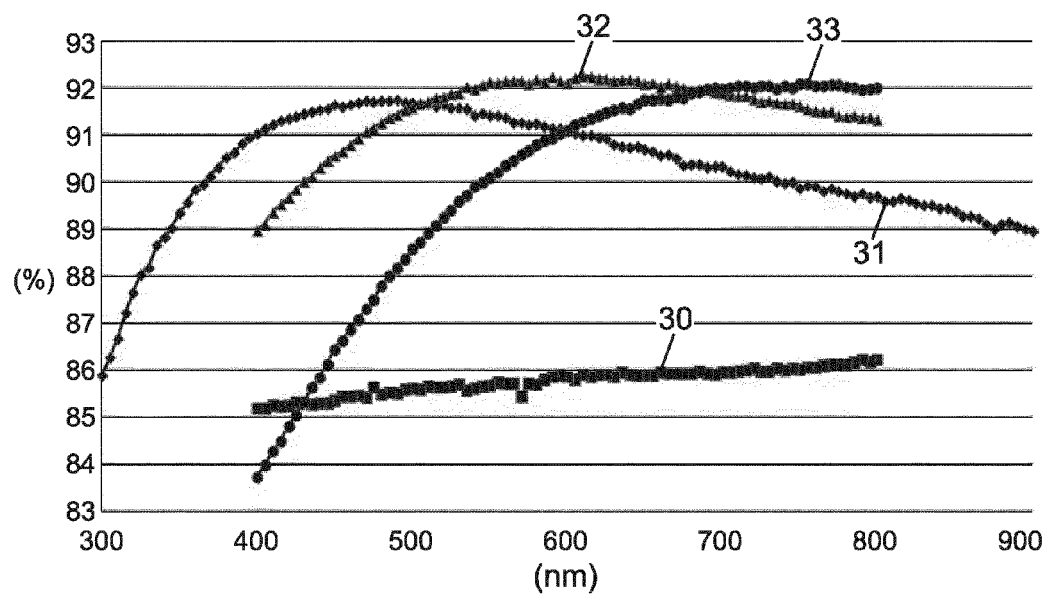
Figure 4:
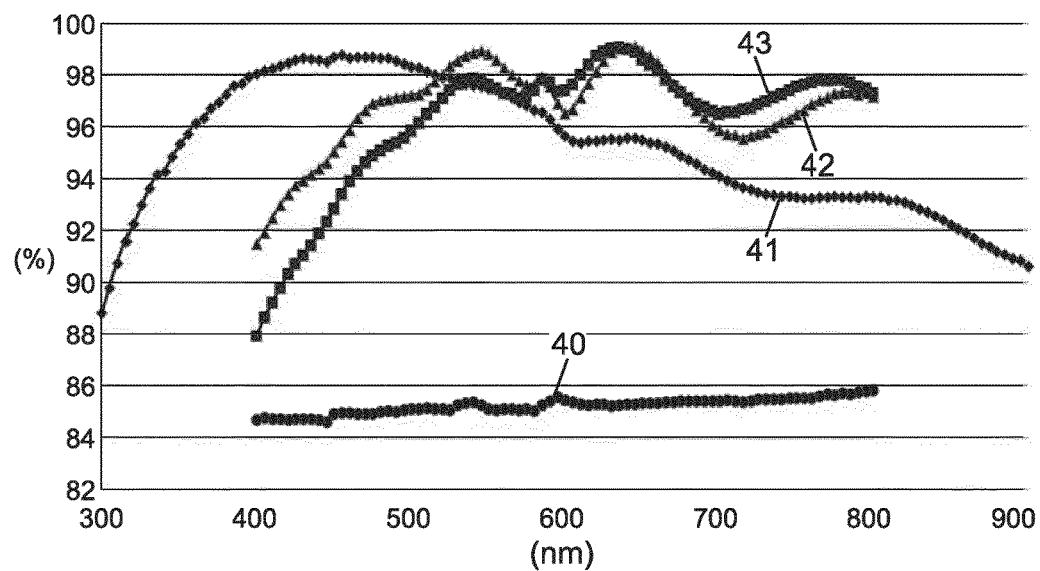
Figure 5:
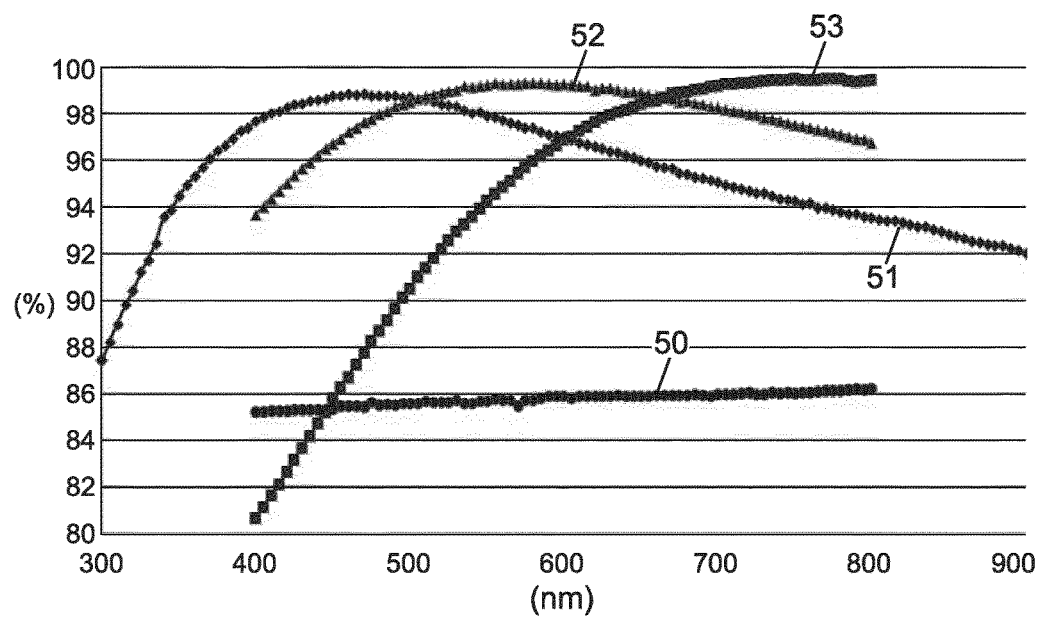

As far as FIGS. 2 and 3 are concerned: only a face of the sapphire material samples has been treated;

As far as FIGS. 4 and 5 are concerned: both faces of the sapphire material samples have been treated.

As far as FIGS. 2 and 4 are concerned: plan(s) A of the sapphire material samples has (have) been treated.

As far as FIGS. 3 and 5 are concerned: plan(s) C of the sapphire material samples has (have) been treated.

In following data, ion doses (further called "dose") are expressed in $10^{16}$ ions/cm$^2$, and acceleration voltages (further called "voltage") are expressed in kV.

In FIG. 2, curve 20 relates to an untreated sapphire material sample; curve 21 to a sapphire material sample treated with a dose=11 and a voltage=17.5; curve 22 to a sapphire material sample treated with a dose=12.5 and a voltage=25; curve 23 to a sapphire material sample treated with a dose=15 and a voltage=32.5.

In FIG. 3, curve 30 relates to an untreated sapphire material sample; curve 31 to a sapphire material sample treated with a dose=11 and a voltage=17.5; curve 32 to a sapphire material sample treated with a dose=12.5 and a voltage=25; curve 33 to a sapphire material sample treated with a dose=15 and a voltage=32.5.

In FIG. 4, curve 40 relates to an untreated sapphire material sample; curve 41 to a sapphire material sample treated with a dose=11 and a voltage=17.5; curve 42 to a sapphire material sample treated with a dose=12.5 and a voltage=25; curve 43 to a sapphire material sample treated with a dose=15 and a voltage=32.5.

In FIG. 5, curve 50 relates to an untreated sapphire material sample; curve 51 to a sapphire material sample treated with a dose=11 and a voltage=17.5; curve 52 to a sapphire material sample treated with a dose=12.5 and a voltage=25; curve 53 to a sapphire material sample treated with a dose=15 and a voltage=32.5.

Thanks to these figures, one can consider the influence of a plurality of process parameters.

FIGS. 2 and 3 can be respectively compared to FIGS. 4 and 5 to demonstrate the influence of single face versus double faces treatments.

Measured results reported in FIGS. 2 to 5 demonstrate that bombardment of a surface of the sapphire material according to the present invention modifies the reflected colour of a sapphire material surface.

The reflected colour of a sapphire material surface of samples corresponding to curves 21, 31, 41 and 51, where the voltage is 17.5 kV, is substantially orange;

The reflected colour of a sapphire material surface of samples corresponding to curves 22, 32, 42 and 52, where the voltage is 25 kV, is substantially purple;

The reflected colour of a sapphire material surface of samples corresponding to curves 23, 33, 43 and 53, where the voltage is 32.5 kV, is substantially dark blue.

One can accordingly make a reflected colour choice for a sapphire material surface and choose relevant treatment method parameters that permit obtaining the desired colour.

Based on such type of experiments, one can gather data and handle them so as to provide further guidelines of colour variation of a sapphire surface according to an element (here Oxygen) of the single- and/or multi-charged ions beam, the acceleration voltage and the ion dose per unit of surface area.

Measured results reported in FIGS. 2 to 5 demonstrate that bombardment of a surface of the sapphire material, said surface facing a medium different from the sapphire material, by a single- and/or multi-charged gas ion beam is also suitable to produce an ion implanted layer in the sapphire material that provides an anti-glare treatment in the visible range.

Surprisingly, very high transmissions have been achieved in the visible range.

Synthetic sapphire material comprising at least one surface with implanted ions have been obtained where the reflection of an incident wave in the visible range on said surface is equal or less to 2%, as for example equal or less to 1%, when measured at a 560 nm wavelength.

Thanks to results reported in FIGS. 2 to 5, one can determine preferred ranges to implement the method according to the present invention.

Determining said preferred ranges is a way to provide additional choice rules to choose ions of an element, an acceleration voltage and a dose of implanted single- and/or multi-charged gas ions according to needs.

FIGS. 6 to 10 illustrate data that can be useful for choosing parameters when using Oxygen as single- and/or multi-charged ions.

Figure 6:
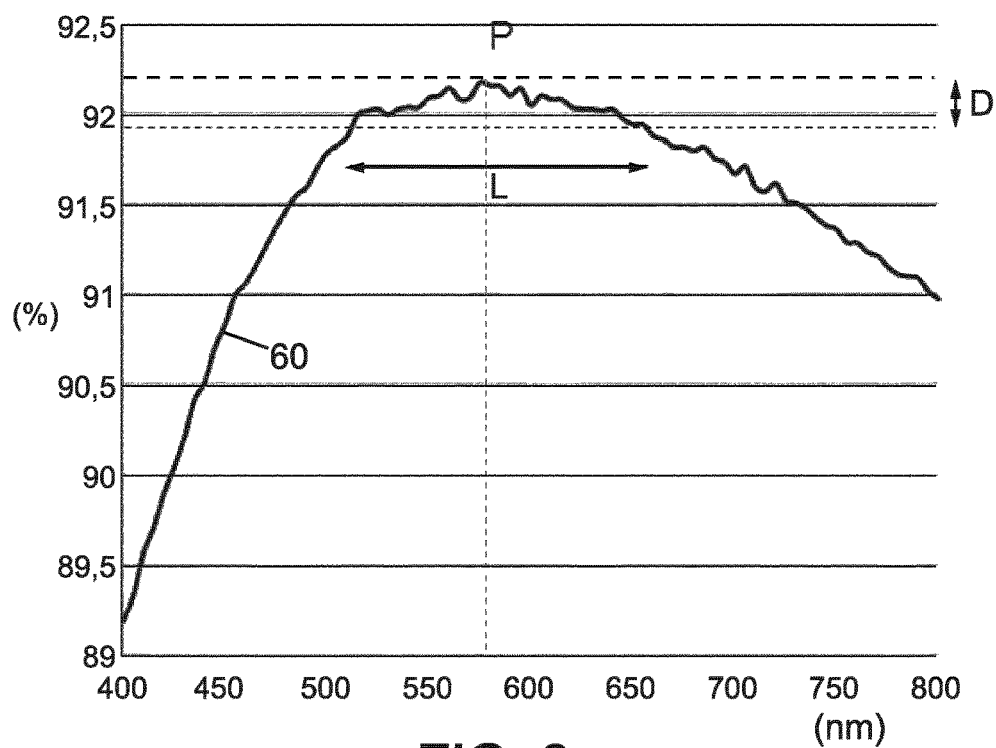

Transmission diagrams of sapphire material samples treated by the method of the present invention can be analyzed on the basis of FIG. 6; one determinate three parameters on the basis of transmission diagram (60), where P is the transmission peak position (in nm), D is a variability parameter (in transmission unit), L is the width (in nm) of the transmission diagram corresponding to the D variability.

Figure 7:
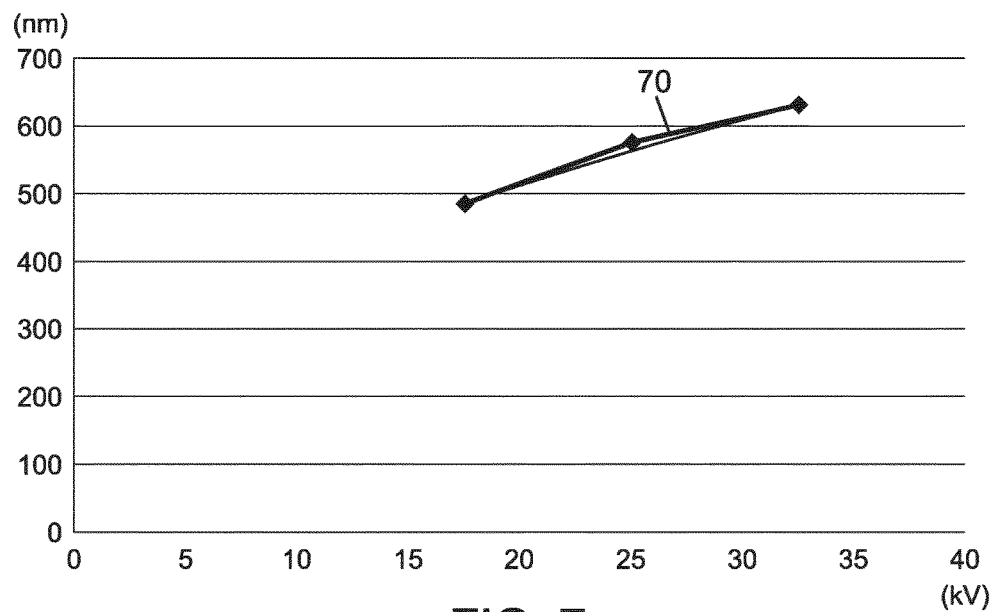
FIGS. 7 to 10 are diagrams used to discuss results of sapphire material samples treated by the method of the present invention.
Figure 8:
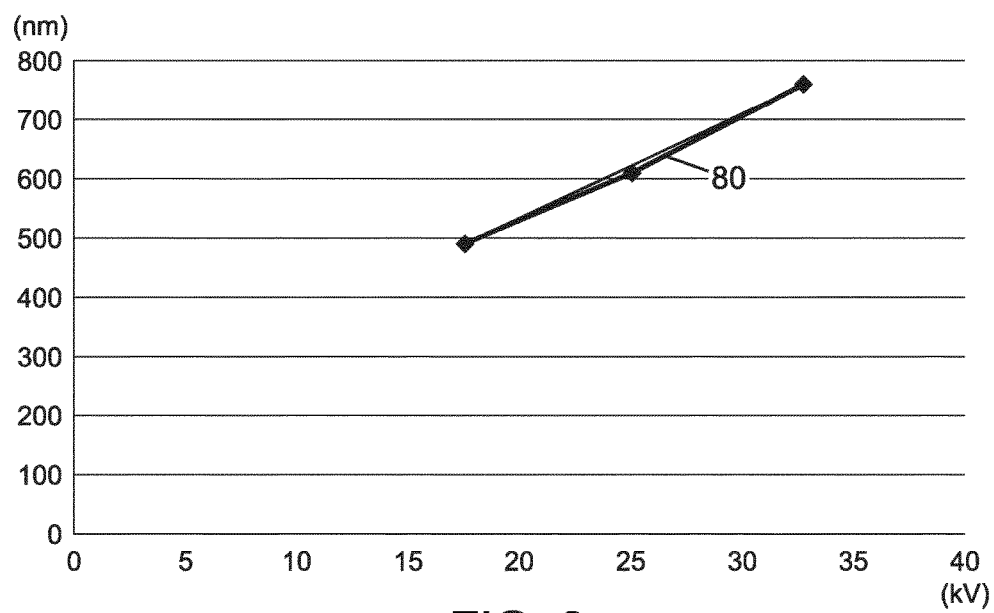

FIGS. 7 and 8 illustrate the variation of the transmission peak position (respectively, curves 70 and 80) according to the acceleration voltage for respectively plans A and C of a sapphire material.

Thanks to such diagram, one can choose an acceleration voltage for obtaining a desired colour.

Figure 9:
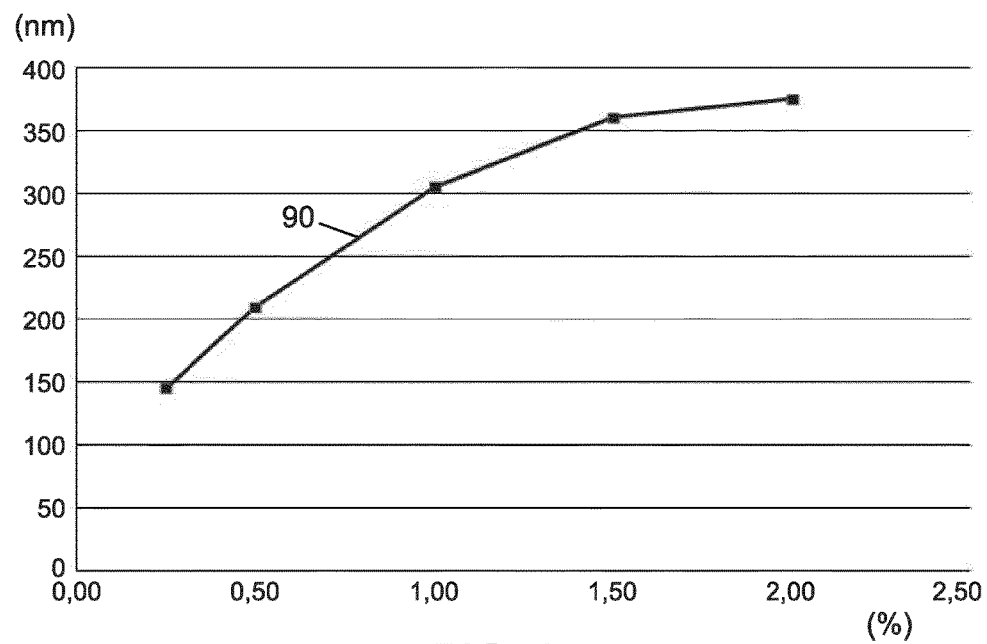

FIG. 9 shows the variation of the width of the transmission diagram (L) as a function of the variability parameter (D) for a sapphire material treated according to a A plane.

Figure 10:
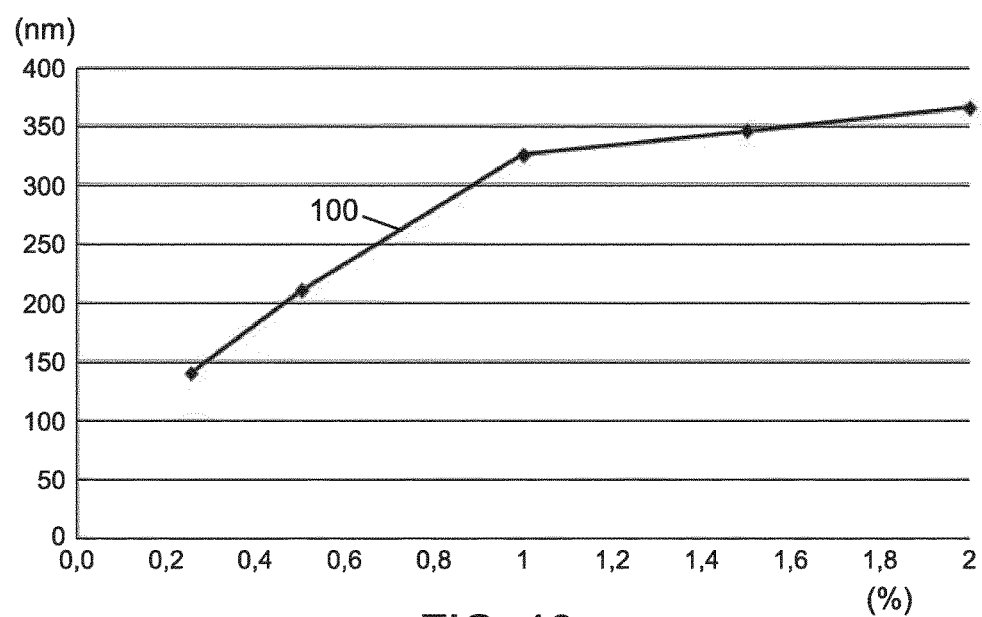

FIG. 10 shows the variation of the width of the transmission diagram (L) as a function of the variability parameter (D) for a sapphire material treated according to a C plane.

Numerous other data presentations can be used to provide additional choice rules for obtaining a desired colour.

As shown by here above results, the treatment method of the invention may be used so as to produce an ion implanted layer on a single surface of the sapphire material or may be used so as to produce a plurality of ion implanted layers on a first and a second sapphire material surface of the sapphire material, where the first and the second sapphire material surface are substantially parallel surfaces and separated by a transparent medium.

FIGS. 11 to 14 illustrate examples of modifying the reflected colour of sapphire material surfaces thanks to the method of the present invention when using a plurality of single- and/or multi-charged gas ion beams so as to produce an ion implanted layer in the sapphire material; similar results would be obtained when using a plurality of ion implanted layers on a first and a second sapphire material surface of the sapphire material, where the first and the second sapphire material surface are substantially parallel surfaces separated by a transparent medium.

Figure 11:
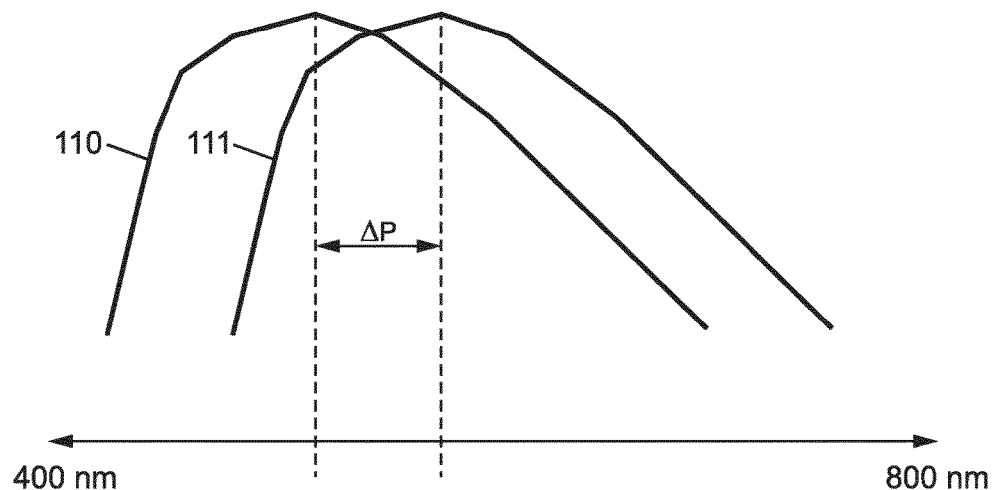
FIGS. 11 to 14 illustrate examples of modifying the reflected colour of sapphire material surfaces thanks to the method of the present invention.

FIG. 11 shows sketches indicating the incidence of a first, 110, and a second, 111, Oxygen multi-charged gas ion beams on transmission within the visible range where the acceleration voltage differ from a gas ion beam to another gas ion beam as far as is concerned. A peak difference ΔP can be seen between the two curves 110, 111. The acceleration voltages are, for example, in the range of 10 to 50 kV, as for example in the range of 15 to 35 kV, and the acceleration voltage difference between to neighbouring is comprised between 5 and 50 kV, between 10 and 20 kV. The inventors have determined the colorimetric properties resulting from the combination of such curves and corresponding data are shown in FIG. 12.

Figure 12:
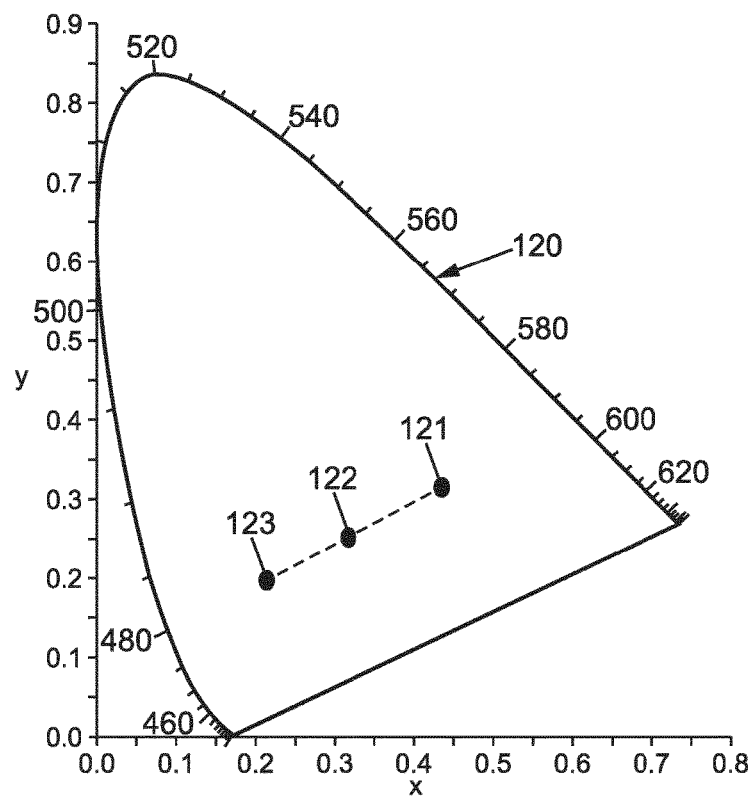

FIG. 12 presents the results in the CIE 1931 colour spaces on the basis of a CIE xy chromaticity diagram. The outer curved boundary 120 is the spectral locus, with wavelengths shown in nanometers. The diagram represents all of the chromaticities visible to the average person. Such diagrams are commonly used in the field of colour information presentation and interpretation of such diagrams is well known from a person skilled in the art. Point 121 corresponds at the chromaticity of a sapphire material surface treated with 15 kV and 25 kV Oxygen multi-charged gas ion beams; corresponding colour is pink. Point 122 corresponds at the chromaticity of a sapphire material surface treated with 20 kV and 30 kV Oxygen multi-charged gas ion beams; corresponding colour is purplish pink. Point 123 corresponds at the chromaticity of a sapphire material surface treated with 25 kV and 35 kV Oxygen multi-charged gas ion beams; corresponding colour is violet/blue.

Figure 13:
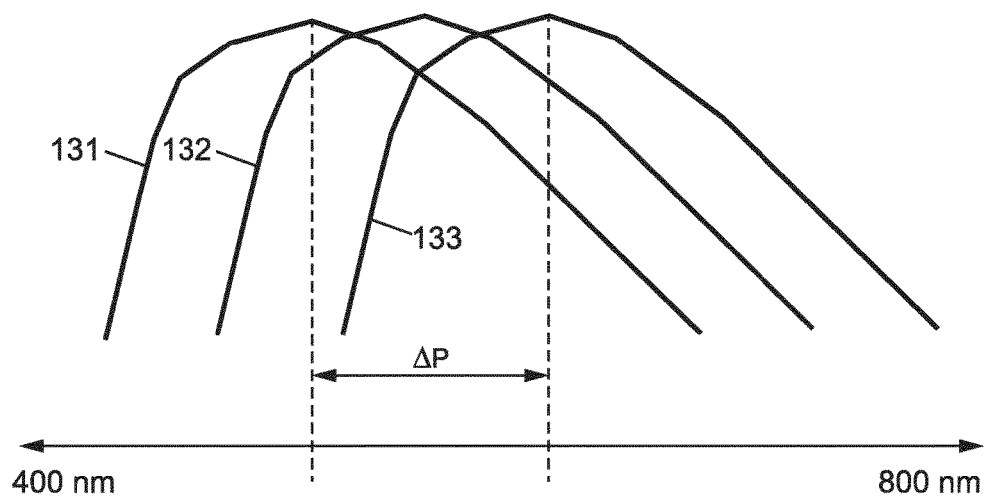

FIG. 13 shows sketches indicating the incidence of a first (131), a second (132) and a third (133) Oxygen multi-charged gas ion beams on transmission within the visible where the acceleration voltage differ from a gas ion beam to another gas ion beam as far as visible range transmission is concerned. A peak difference ΔP can be seen between the two extreme curves 131, 133. The acceleration voltages are defined in the same ranges than those of FIG. 11.

Figure 14:
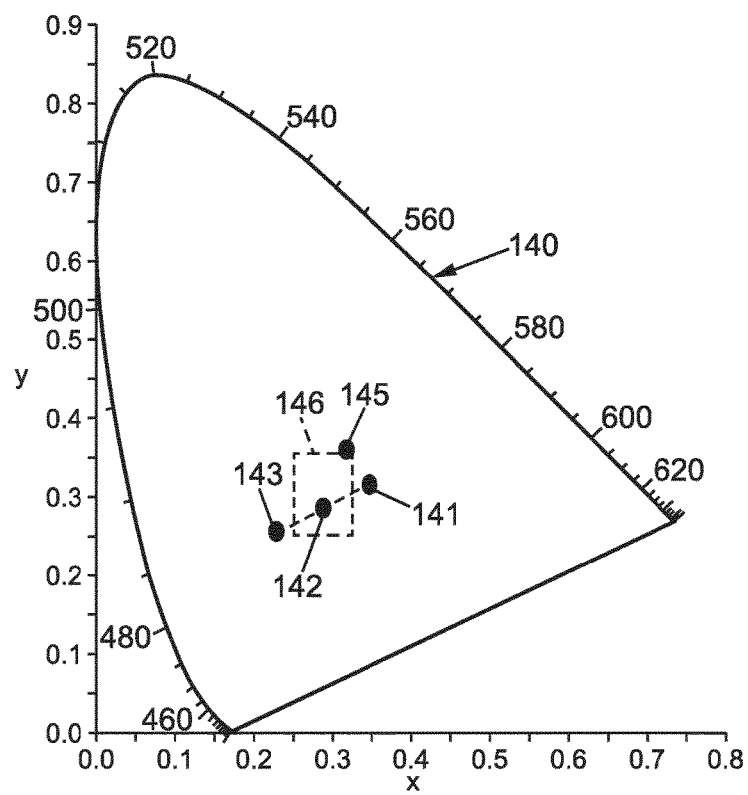

FIG. 14 presents the results in the CIE 1931 colour spaces on the basis of a CIE xy chromaticity diagram. The outer curved boundary 140 is the spectral locus, with wavelengths shown in nanometers. Point 141 corresponds at the chromaticity of a sapphire material surface treated with 10 kV, 20 kV and 30 kV Oxygen multi-charged gas ion beams; corresponding colour is lightly yellowish pink. Point 142 corresponds at the chromaticity of a sapphire material surface treated with 12.5 kV, 22.5 kV and 32.5 kV Oxygen multi-charged gas ion beams; corresponding colour is neutral. Point 143 corresponds at the chromaticity of a sapphire material surface treated with 15 kV, 25 kV and 35 kV Oxygen multi-charged gas ion beams; corresponding colour is light blue.

In CIE xy chromaticity diagram of FIG. 14, one has represented a "neutral colour box" defined by rectangle 146 adjacent to the neutral point 145. Point 142 is situated within said neutral colour box.

Combination of a plurality of Oxygen multi-charged gas ion beams according to the present invention allows finely tuning the reflected colour of the surface of a sapphire material. As here above demonstrated, the method of the invention also allows providing a neutral reflected colour of the surface of a sapphire material with an ion implanted layer. Accordingly one can obtain a neutral coloured anti-glare surface.

Obtaining a neutral reflected colour of the surface of a sapphire material with an ion implanted layer can be achieved by combining a plurality transmission profiles corresponding to different acceleration voltages so as to obtain a flat and constant transmission profile.

According to an embodiment and in order to obtain a flat and constant transmission profile between 96 and 97%, situated between blue (400 nm) and red (800 nm), the inventors also give the following ion bombardment treatment example conducted in two steps:

A first ion bombardment treatment with an extraction voltage approximately 10% less than the reference extraction voltage (suitable for obtaining yellow glare at 45°) and a dose corresponding to half the reference dose (used to obtain the same yellow glare at an angle of 45°), in other words, a voltage approximately equal to 20 KV and a dose equal to $0.75 \times 10^{17}$ ions/cm$^2$;

A second ion bombardment treatment with an extraction voltage approximately 10% greater than the reference extraction voltage (suitable for obtaining yellow glare at 45°) and a dose corresponding to half the reference dose (used to obtain the same yellow glare at an angle of 45°), in other words, a voltage approximately equal to 25 KV and a This two-step treatment makes it possible to advantageously create a flat and constant transmission profile between blue (400 nm) and red (800 nm) while retaining substantially the high transmission for the yellow colour (560 nm).

FIGS. 15 to 19 show transmission diagrams of sapphire material samples treated by the method of the present invention that have been measured after treating sapphire material samples according to following experimental conditions:

As far as FIGS. 15 to 18 are concerned: the single- and/or multi-charged gas ion beam is a single- and multi-charged nitrogen ion, N+, $N^{2+}$, $N^{3+}$, beam; estimated distribution of N ions is following: 57% of $N^+$, 32% of $N^{2+}$, 11% of $N^{3+}$; only one face of the sapphire material samples has been treated.

Figure 15:
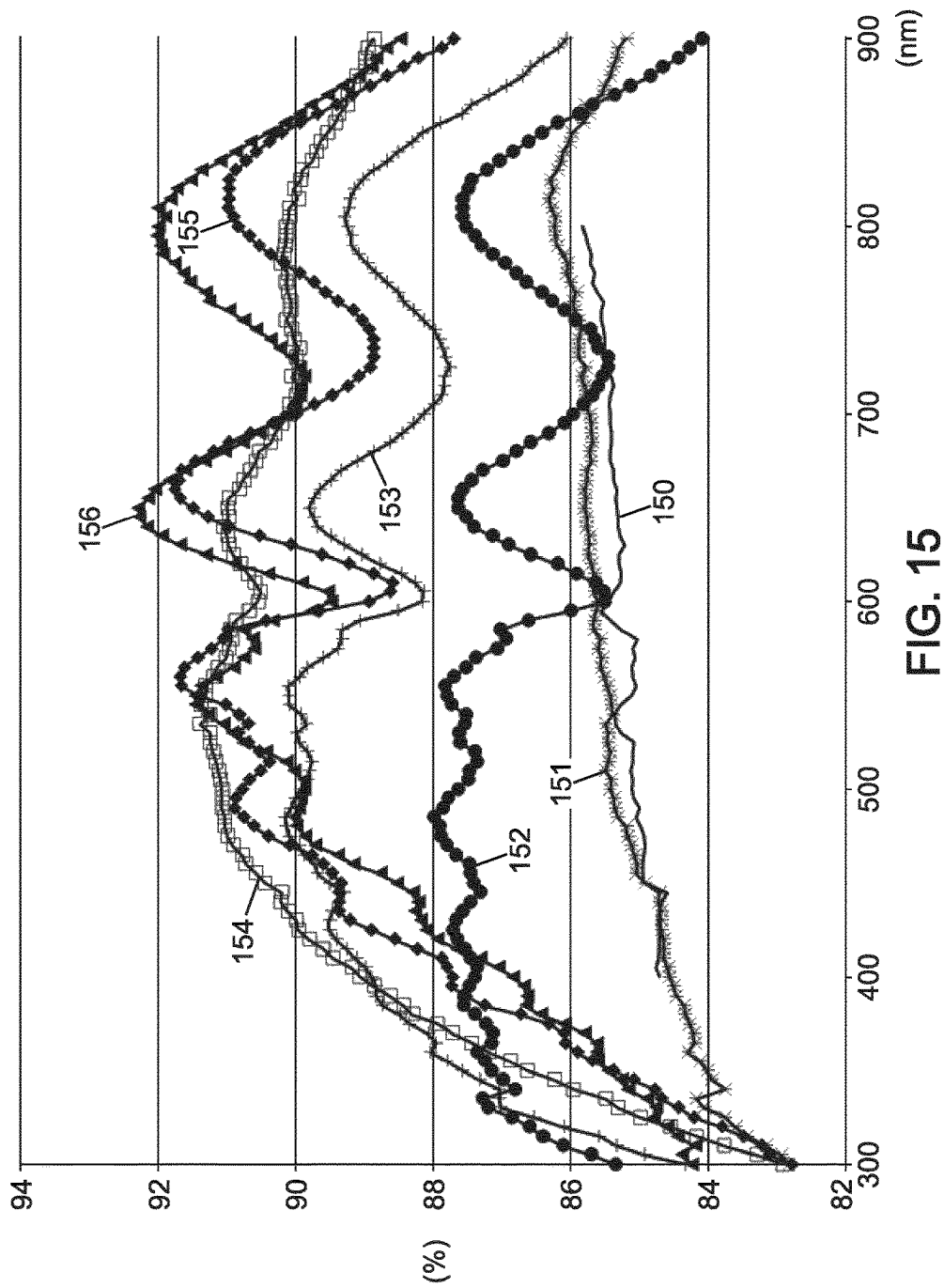
FIGS. 15 to 19 are transmission diagrams of sapphire material samples treated by the method of the present invention.
Figure 16:
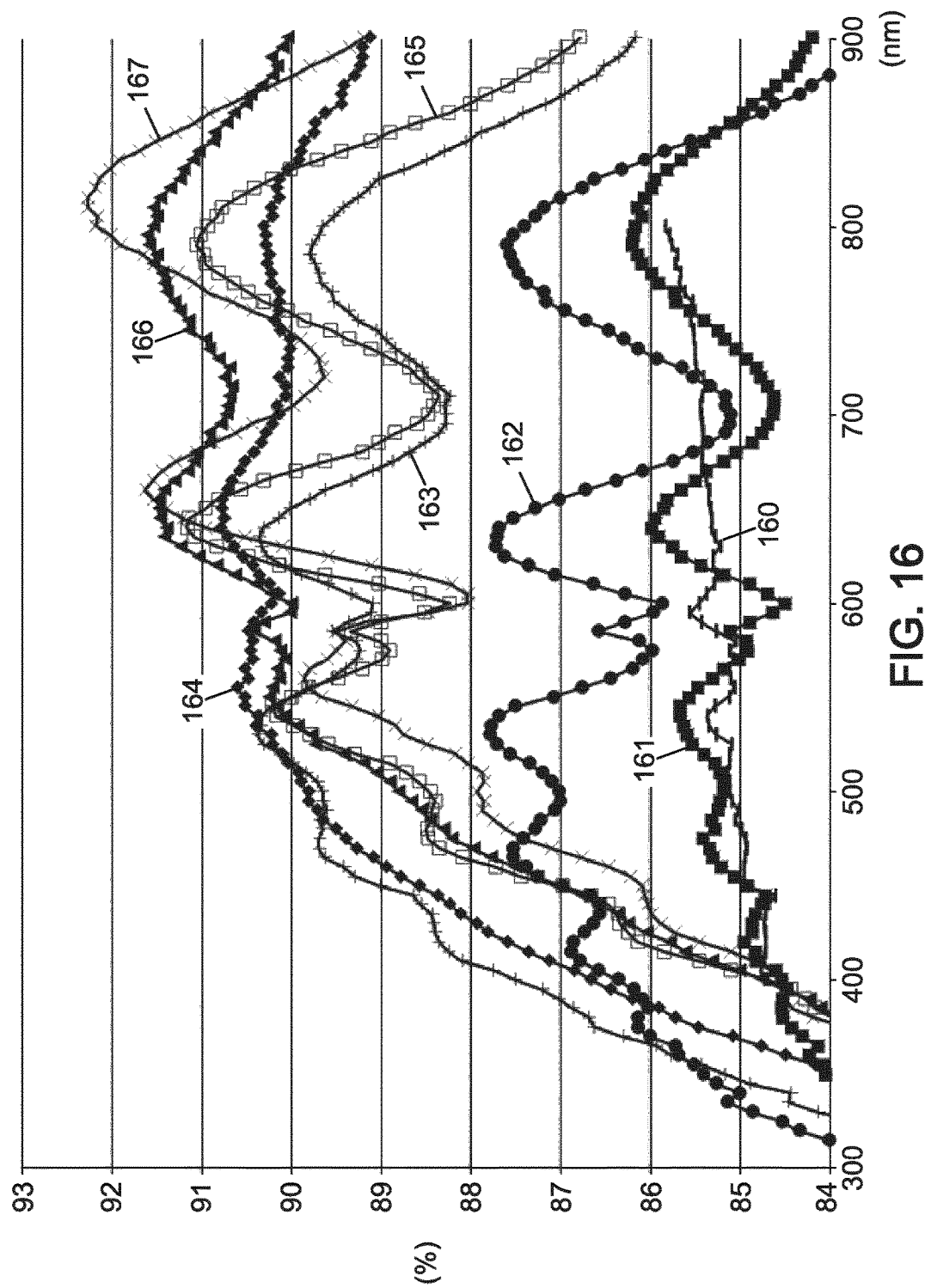

As far as FIGS. 15 and 16 are concerned: plan A of the sapphire material samples has been treated.

Figure 17:
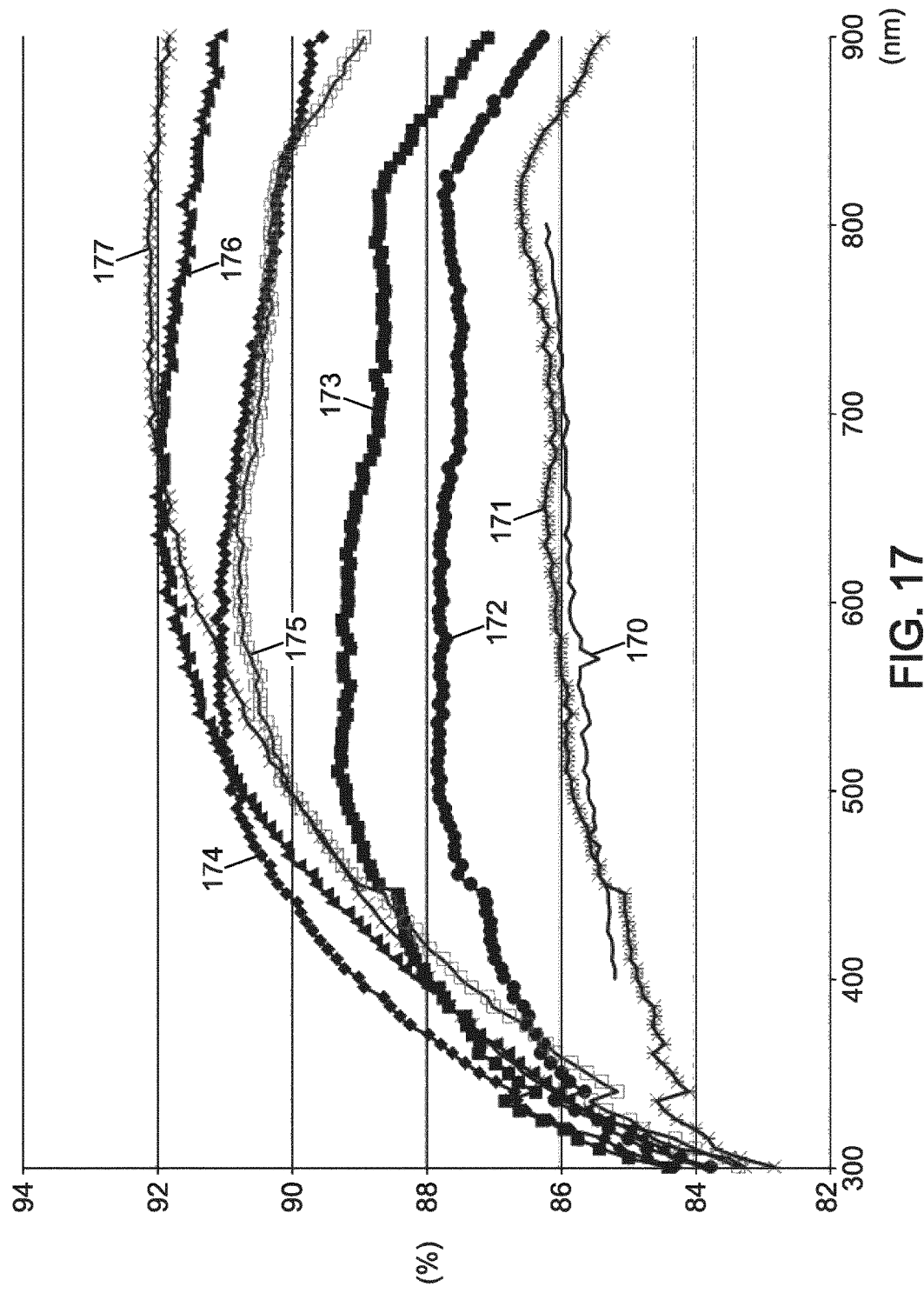
Figure 18:
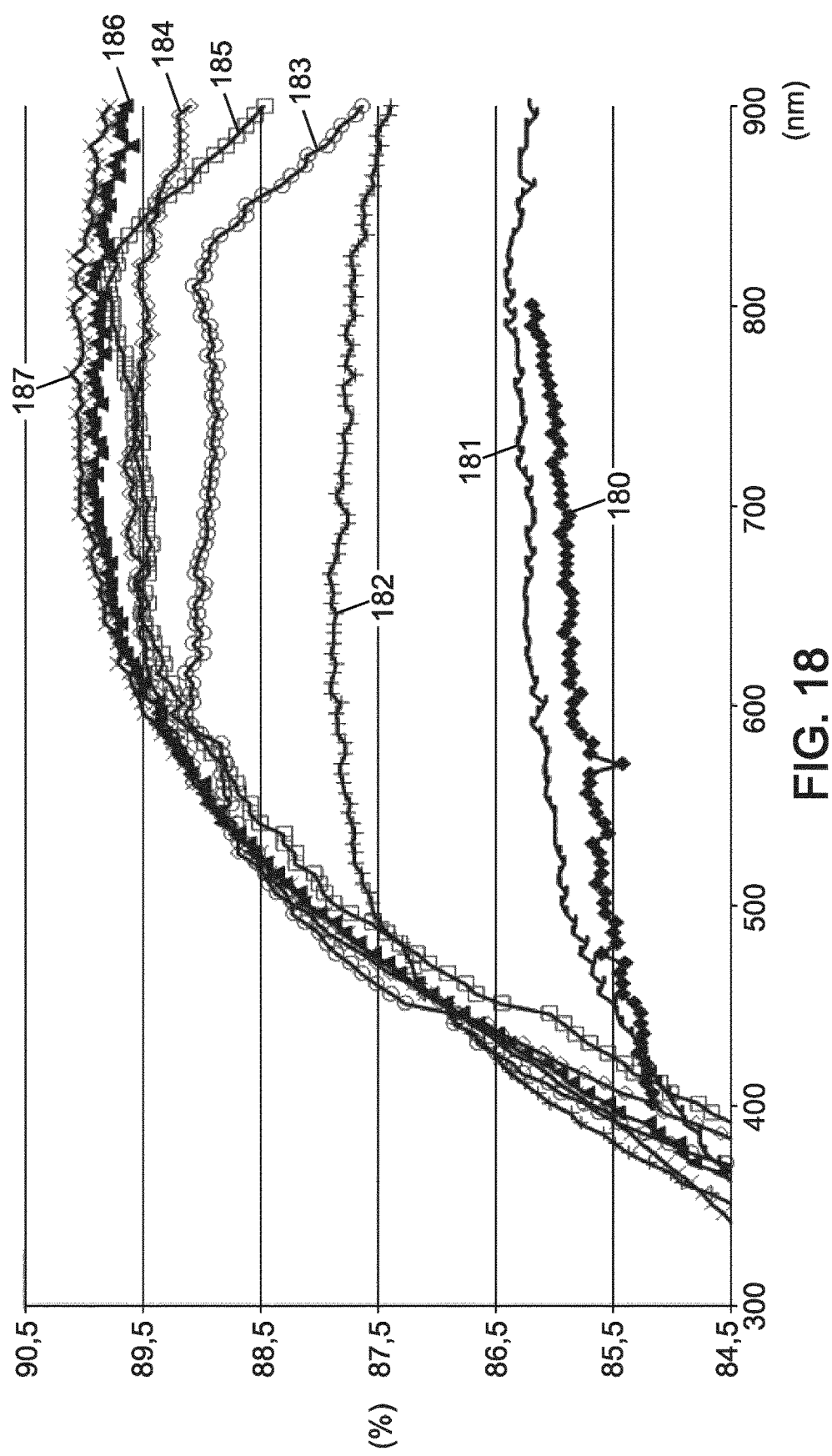

As far as FIGS. 17 and 18 are concerned: plan C of the sapphire material samples has been treated.

In following data, ion doses (further called "dose") are expressed in $10^{16}$ ions/cm², and acceleration voltages (further called "voltage") are expressed in kV.

As far as FIGS. 15 and 17 are concerned, the voltage=20;
As far as FIGS. 16 and 18 are concerned, the voltage=25;

In FIG. 15, curve 150 relates to an untreated sapphire material sample; curve 151 to a sapphire material sample treated with a dose=2.5; curve 152 to a sapphire material sample treated with a dose=5; curve 153 to a sapphire material sample treated with a dose=7.5; curve 154 to a sapphire material sample treated with a dose=10; curve 155 to a sapphire material sample treated with a dose=12.5; curve 156 to a sapphire material sample treated with a dose=15.

In FIG. 16, curve 160 relates to an untreated sapphire material sample; curve 161 to a sapphire material sample treated with a dose=2.5; curve 162 to a sapphire material sample treated with a dose=5; curve 163 to a sapphire material sample treated with a dose=7.5; curve 164 to a sapphire material sample treated with a dose=10; curve 165 to a sapphire material sample treated with a dose=12.5; curve 166 to a sapphire material sample treated with a dose=15; curve 167 to a sapphire material sample treated with a dose=17.5.

In FIG. 17, curve 170 relates to an untreated sapphire material sample; curve 171 to a sapphire material sample treated with a dose=2.5; curve 172 to a sapphire material sample treated with a dose=5; curve 173 to a sapphire material sample treated with a dose=7.5; curve 174 to a sapphire material sample treated with a dose=10; curve 175 to a sapphire material sample treated with a dose=12.5; curve 176 to a sapphire material sample treated with a dose=15; curve 177 to a sapphire material sample treated with a dose=17.5.

In FIG. 18, curve 180 relates to an untreated sapphire material sample; curve 181 to a sapphire material sample treated with a dose=2.5; curve 182 to a sapphire material sample treated with a dose=5; curve 183 to a sapphire material sample treated with a dose=7.5; curve 184 to a sapphire material sample treated with a dose=10; curve 185 to a sapphire material sample treated with a dose=12.5; curve 186 to a sapphire material sample treated with a dose=15; curve 187 to a sapphire material sample treated with a dose=17.5.

Samples that have treated with a 20 kV acceleration voltage are royal blue; samples that have treated with a 15 kV acceleration voltage are mauve.

Modification of the reflected colour of a sapphire material surface can thus be achieved thanks to the method of the invention when using Nitrogen ions. Anti-glare properties can be also achieved thanks to the method of the invention when using Nitrogen ions.

Figure 19:
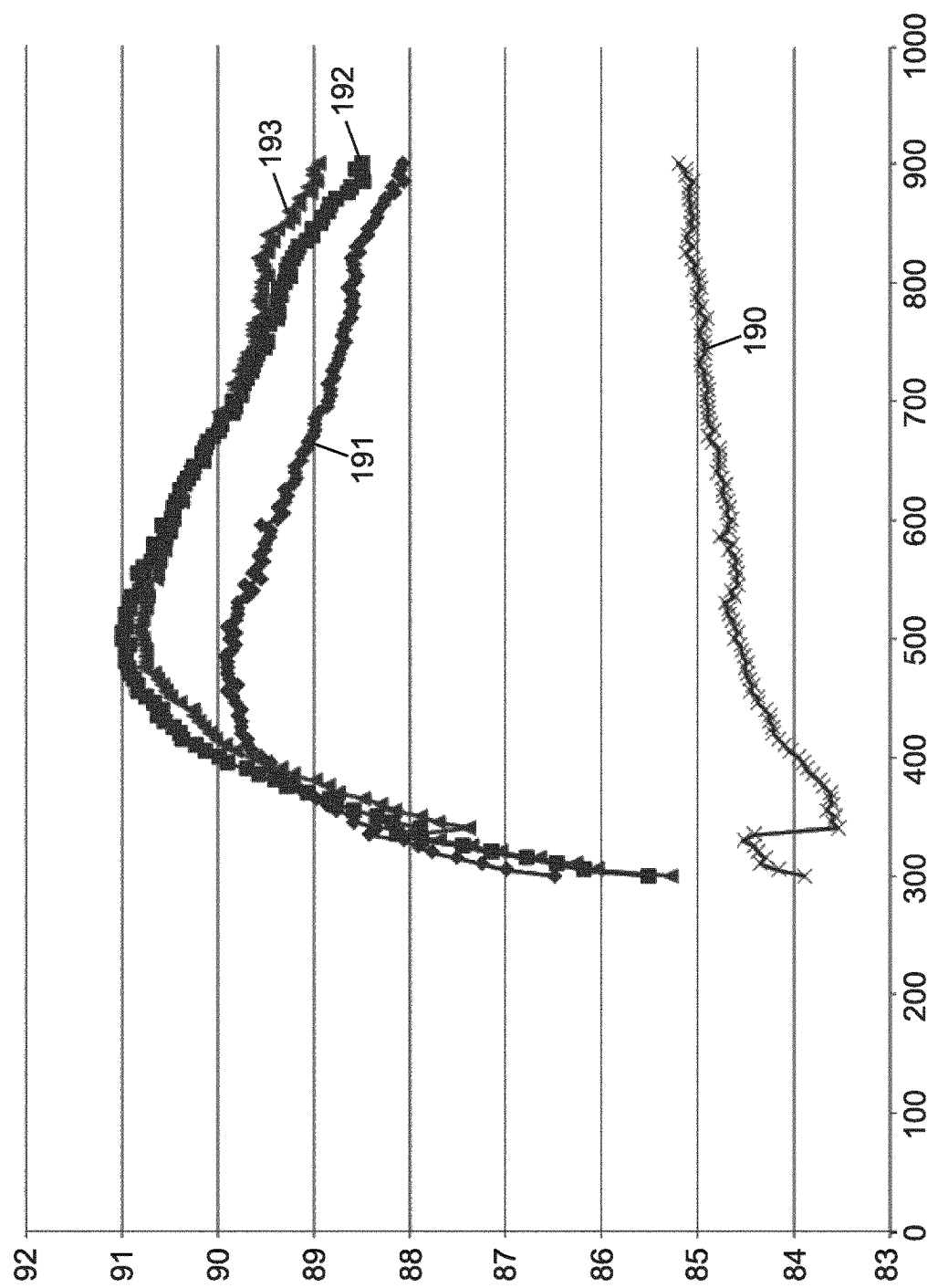

FIG. 19 shows transmission diagrams of sapphire material samples treated by the method of the present invention that have been measured after treating sapphire material samples according to following experimental conditions:

the single- and/or multi-charged gas ion beam is a single- and multi-charged Argon ion, Ark, $Ar^{2+}$, $Ar^{3+}$, beam; estimated distribution of Ar ions is following: 71% of Ark, 23% of $Ar^{2+}$, 6% of $Ar^{3+}$; the two faces of the sapphire material samples have been treated. The treated is plan A of the sapphire material. The acceleration voltage is 35 kV. In following data, ion doses (further called "dose") are expressed in $10^{16}$ ions/cm²:

Curve 190 relates to an untreated sapphire material sample; curve 191 to a sapphire material sample treated with a dose=2.5; curve 192 to a sapphire material sample treated with a dose=7.5; curve 193 to a sapphire material sample treated with a dose=10.

Modification of the reflected colour of a sapphire material surface can thus be achieved thanks to the method of the invention when using Argon ions. Anti-glare properties can be also achieved thanks to the method of the invention when using Argon ions.

Based on the data that have been gathered, one can estimate with a high level of confidence that other ions should be suitable to implement the method of the invention and are relevant to modify the reflected colour of a sapphire material surface.

It has been here above demonstrated that argon (Ar) ions are suitable to implement the method of the invention; accordingly, other "noble" gas ions appears to be also suitable to implement the method of the invention, such as helium (He), neon (Ne), krypton (Kr) and xenon (Xe).

It has been here above demonstrated that nitrogen (N) and oxygen (O) ions are suitable to implement the method of the invention; accordingly, other Periodic Table surrounding ions appears to be also suitable to implement the method of the invention, such as boron (B), carbon (C), fluorine (F), silicon (Si), phosphorus (P) and sulphur (S).

Based on here above results and comments, a person skilled in the art can use the teaching of the present invention and implement the treatment method by using a plurality of beams where the element of the ions beams differ from a gas ion beam to another gas ion beam. Said beams may be used so as to produce an ion implanted layer on a single surface of the sapphire material or may be used so as to produce a plurality of ion implanted layers on a first and a second sapphire material surface of the sapphire material, where the first and the second sapphire material surface are substantially parallel surfaces and separated by a transparent medium.

According to an embodiment, the ion bombardment anti-reflective treatment of the sapphire material used in the present invention does not require long treatment times (a few seconds per cm² and per micro-accelerator).

The modification of the reflected colour of a sapphire material surface used in the present invention may enable the use thereof in an industrial context, where the cost thereof should not be redhibitory in relation to the costs of the sapphire substrate (for example one cm² of sapphire for touch panels costs approximately 4 Euro, one cm² treated within the scope of the invention costs a few cents).

Thanks to the present invention, one can obtain a part made of synthetic sapphire material comprising at least one surface treated according to the method of any of preceding claims, wherein the dominant wavelength, $\lambda_{DT}$, of the reflected colour of the treated surface is shifted from at least +50 nm or at least −50 nm from the dominant wavelength, $\lambda_{DU}$, of the reflected colour of the untreated sapphire material surface, as for example shifted from at least +100 nm or at least −100 nm.

The treatment method of the present invention can be used for treating a solid part made of sapphire material chosen for example from, but not limited to, the list consisting of a screen, such as for example a touch screen, a window, a watch glass, a lighting device part, such as a light emitting device (LED) part, an optical component, such as for example device lens.

The invention has been described above with the aid of embodiments without limitation of the general inventive concept; in particular the parameters are not limited to the examples discussed.

The invention claimed is:

1. A treatment method for modifying the reflected colour of a sapphire material surface comprising bombardment by a gas ion beam so as to produce an ion implanted layer in the sapphire material, wherein:
   the gas ion beam comprises single and multi-charged ions, and comprises 10% or more of multi-charged ions,
   the acceleration voltage is chosen in a range between 5 kV and 1000 kV;
   the dose of implanted gas ions per unit of surface area of each ion beam is chosen in a range between $10^{12}$ ions/cm$^2$ and $10^{18}$ ions/cm$^2$; and,
   the dose of implanted gas ions and the acceleration voltage are further chosen so that to obtain a modified reflected colour of the treated sapphire material surface compared to the untreated sapphire material surface; and,
   the ions of the gas ion beam are selected from ions of the elements from the group consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S).

2. The treatment method of claim 1, wherein the ions are selected from ions of the elements from the group consisting of helium (He), neon (Ne), argon (Ar), krypton (Kr), xenon (Xe), nitrogen (N) and oxygen (O).

3. The treatment method of claim 1, wherein ions for bombardment by the gas ion beam are produced by an electron cyclotron resonance (ECR) source.

4. The treatment method of claim 1, wherein the acceleration voltage is chosen in a range between 10 kV and 100 kV.

5. The treatment method of claim 1, wherein the dose of implanted gas ions per unit of surface area is chosen in a range between $10^{16}$ ions/cm$^2$ and $10^{18}$ ions/cm$^2$.

6. The treatment method of claim 1, wherein the dose of implanted gas ions per unit of surface area is chosen to obtain an atomic concentration of implanted ions greater or equal to 5% and equal or less than 20%.

7. The treatment method of claim 1, wherein the sapphire material is movable in relation to the gas ion beam at a speed, $V_D$, between 0.1 mm/s and 1000 mm/s.

8. The treatment method of claim 7, wherein the same zone of sapphire material is moved under the gas ion beam along a plurality, NP, of passes at the speed $V_D$.

9. The treatment method of claim 1, wherein the treatment comprises bombardment of the sapphire material surface by a plurality of gas ion beams so as to produce an ion implanted layer in the sapphire material, and wherein the acceleration voltage and/or the element of the ions beams differ from a gas ion beam to another gas ion beam.

10. The treatment method of claim 1, wherein the method comprises bombardment a first and a second sapphire material surface, each by one or by a plurality of gas ion beam(s) so as to produce in the sapphire material an ion implanted layer on the first sapphire material surface and an ion implanted layer on the second sapphire material surface, wherein the first and the second sapphire material surface are substantially parallel surfaces separated by a transparent medium and wherein the acceleration voltage and/or the element of the beam(s) for the treatment of the second sapphire material surface differs from respectively the acceleration voltage(s) and/or the element of the ion beam(s) for the treatment of the first sapphire material surface.

11. The treatment method of claim 9, wherein the ions of the different gas ion beams are ions of the same element and wherein the acceleration voltage of the ion beams differ from a gas ion beam to another gas ion beam.

12. The treatment method of claim 11, wherein the acceleration voltage of the ion beams differ by a value between 5 and 50 kV.

13. The treatment method of claim 1, wherein the acceleration voltage and the dose of implanted gas ions are further chosen according to additional choice rules and;
   wherein the additional choice rules comprise using data gathered in a step prior to bombardment by the gas ion beam of the sapphire material to be treated, wherein:
      said step consists in choosing one type of single- and multi-charged ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S), performing a plurality of experiments with sapphire materials similar to the one to be treated by using said ions to be bombarded and varying the implanted single- and/or multi-charged gas ion dose per unit of surface area and the acceleration voltage until determining desired implanted single- and/or multi-charged gas ion dose per unit of surface area ranges and acceleration voltage ranges so as to produce an ion implanted layer suitable for obtaining a modified reflected colour of the sapphire material surface; and
      choosing a single- and multi-charged gas ion dose per unit of surface area and an acceleration voltage value within the ranges of the preceding step and treating the sapphire material to be treated with said ions said values.

14. The treatment method of claim 13 wherein data resulting from the plurality of experiments are gathered and handled so as to provide guidelines of colour variation of a sapphire surface according to the element of the single- and multi-charged ions beam, the acceleration voltage and the ion dose per unit of surface area.

15. The treatment method of claim 14 wherein the choice of the element of the single- and multi-charged ions beam, of the single- and multi-charged gas ion dose per unit of surface area and of the acceleration voltage value is done so as to fulfil the requirements of a colour target for the reflected colour of a sapphire material surface.

16. A part made of synthetic sapphire material comprising at least one surface treated according to the method of claim 1, wherein the dominant wavelength, $\lambda_{DT}$, of the reflected colour of the treated surface is shifted from at least +50 nm or at least −50 nm from the dominant wavelength, $\lambda_{DU}$, of the reflected colour of the untreated sapphire material surface.

17. The treatment method according to claim 1, wherein the sapphire material is a synthetic sapphire material of a solid part selected from the group consisting of a screen, a window, a watch glass, a lighting device part, and an optical component.

18. The treatment method of claim 10, wherein the ions of the different gas ion beams are ions of the same element and wherein the acceleration voltage of the ions beams differ from a gas ion beam to another gas ion beam.

19. The treatment method of claim 18, wherein the acceleration voltage of the ion beams differ from a value comprised between 5 and 50 kV.

20. The treatment method of claim 1, wherein the ions of the gas ion beam are selected from ions of the elements from the group consisting of nitrogen (N) and oxygen (O).

21. The treatment method of claim 1, wherein the ions of the gas ion beam are ions of oxygen (O).

22. The treatment method of claim 1, wherein the dose of implanted gas ions per unit of surface area is chosen in a range between $2\times10^{16}$ ions/cm$^2$ and $2\times10^{17}$ ions/cm$^2$.

23. The treatment method of claim 11, wherein the acceleration voltage of the ion beams differs by a value of 10 to 20 kV.

24. A part made of synthetic sapphire material comprising at least one surface treated according to the method of claim 1, wherein the dominant wavelength, $\lambda_{DT}$, of the reflected colour of the treated surface is shifted from at least +100 nm or at least −100 nm from the dominant wavelength, $\lambda_{DU}$, of the reflected colour of the untreated sapphire material surface.

25. The treatment method of claim 17, wherein the screen is a touch screen, the lighting device part is a light emitting device (LED) part, and the optical component is a device lens.

* * * * *